(12) United States Patent
Takeya et al.

(10) Patent No.: US 11,024,786 B2
(45) Date of Patent: Jun. 1, 2021

(54) DISPLAY APPARATUS AND MANUFACTURING METHOD THEREOF

(71) Applicant: Seoul Semiconductor Co., Ltd., Ansan-si (KR)

(72) Inventors: Motonobu Takeya, Ansan-si (KR); Young Hyun Kim, Ansan-si (KR); Jong Ik Lee, Ansan-si (KR); Kwang Yong Oh, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 16/684,422

(22) Filed: Nov. 14, 2019

(65) Prior Publication Data

US 2020/0083422 A1  Mar. 12, 2020

Related U.S. Application Data

(63) Continuation of application No. 15/997,620, filed on Jun. 4, 2018, which is a continuation of application
(Continued)

(51) Int. Cl.
*H01L 33/62* (2010.01)
*H01L 33/50* (2010.01)
(Continued)

(52) U.S. Cl.
CPC .......... *H01L 33/62* (2013.01); *H01L 25/0753* (2013.01); *H01L 27/124* (2013.01);
(Continued)

(58) Field of Classification Search
None
See application file for complete search history.

(56) References Cited

U.S. PATENT DOCUMENTS 7,683,981 B2  3/2010  Uemoto
8,426,227 B1  4/2013  Bibl et al.
(Continued)

FOREIGN PATENT DOCUMENTS

JP  2015-500562  1/2015
KR  10-2007-0087291  8/2007
(Continued)

OTHER PUBLICATIONS

International Search Report dated Jun. 8, 2017, in International Application No. PCT/KR2017/001985.
(Continued)

*Primary Examiner* — Zandra V Smith
*Assistant Examiner* — Lawrence C Tynes, Jr.
(74) *Attorney, Agent, or Firm* — H.C. Park & Associates, PLC

(57) ABSTRACT

A display apparatus including a panel substrate including a TFT drive circuit for active matrix driving, a plurality of light emitting diodes, and an anisotropic conductive film electrically connecting the light emitting diodes to the panel substrate, in which the anisotropic conductive film includes an adhesive organic insulation material and conductive particles dispersed in the adhesive organic insulation material.

14 Claims, 8 Drawing Sheets

Related U.S. Application Data

No. 15/443,132, filed on Feb. 27, 2017, now Pat. No. 9,997,688.

(60) Provisional application No. 62/379,501, filed on Aug. 25, 2016, provisional application No. 62/300,249, filed on Feb. 26, 2016.

(51) Int. Cl.
*H01L 27/15* (2006.01)
*H01L 27/12* (2006.01)
*H01L 25/075* (2006.01)

(52) U.S. Cl.
CPC ........ *H01L 27/1259* (2013.01); *H01L 27/153* (2013.01); *H01L 33/502* (2013.01); *H01L 33/504* (2013.01); *H01L 33/507* (2013.01); *H01L 2224/48091* (2013.01); *H01L 2224/48227* (2013.01); *H01L 2933/0066* (2013.01)

(56) References Cited

U.S. PATENT DOCUMENTS

| | | | | |
|---|---|---|---|---|
| 8,877,561 | B2* | 11/2014 | Tischler | H01L 24/83 438/119 |
| 8,941,566 | B2 | 1/2015 | Haase | |
| 9,293,666 | B2 | 3/2016 | Lee et al. | |
| 10,483,434 | B2* | 11/2019 | Liu | H01L 33/62 |
| 2001/0011868 | A1* | 8/2001 | Fukunaga | H01L 51/5234 313/506 |
| 2004/0195959 | A1 | 10/2004 | Park et al. | |
| 2005/0007015 | A1* | 1/2005 | Yokoyama | H01L 51/5218 313/506 |
| 2005/0230853 | A1* | 10/2005 | Yoshikawa | H01L 24/83 257/81 |
| 2007/0075627 | A1* | 4/2007 | Kimura | H01L 27/3216 313/503 |
| 2007/0207571 | A1 | 9/2007 | Morisue et al. | |
| 2008/0084365 | A1 | 4/2008 | Takahara et al. | |
| 2008/0144334 | A1* | 6/2008 | Shin | H01L 25/0753 362/612 |
| 2011/0001146 | A1 | 1/2011 | Yamazaki et al. | |
| 2011/0096560 | A1 | 4/2011 | Ryu et al. | |
| 2013/0335940 | A1* | 12/2013 | Matsui | H01L 24/16 361/783 |
| 2014/0159067 | A1 | 6/2014 | Sakariya et al. | |
| 2014/0367633 | A1 | 12/2014 | Bibl et al. | |
| 2014/0367711 | A1 | 12/2014 | Bibl et al. | |
| 2015/0108403 | A1* | 4/2015 | Kawamura | C09K 19/12 252/299.63 |
| 2015/0116985 | A1 | 4/2015 | Bang | |
| 2015/0221619 | A1 | 8/2015 | Rhee | |
| 2015/0228865 | A1* | 8/2015 | Rhee | H01L 33/58 257/90 |
| 2015/0255505 | A1 | 9/2015 | Jeoung et al. | |
| 2016/0005381 | A1 | 1/2016 | Yata et al. | |
| 2016/0087240 | A1 | 3/2016 | Choi et al. | |
| 2016/0126224 | A1 | 5/2016 | Lee et al. | |
| 2016/0128159 | A1* | 5/2016 | Usami | H05B 33/04 313/504 |
| 2016/0133795 | A1* | 5/2016 | Usami | H01L 33/44 438/26 |
| 2016/0293805 | A1 | 10/2016 | Choi | |
| 2016/0300745 | A1 | 10/2016 | Chang et al. | |
| 2016/0315068 | A1* | 10/2016 | Lee | H01L 33/62 |
| 2017/0025399 | A1* | 1/2017 | Takeya | H05B 33/12 |
| 2017/0047393 | A1* | 2/2017 | Bower | H01L 33/58 |
| 2017/0179192 | A1* | 6/2017 | Zhang | H01L 25/50 |
| 2017/0194304 | A1* | 7/2017 | Takeya | H01L 25/162 |
| 2017/0250164 | A1* | 8/2017 | Takeya | H01L 25/0753 |
| 2017/0250329 | A1* | 8/2017 | Takeya | H01L 27/1259 |
| 2017/0287887 | A1* | 10/2017 | Takeya | H01L 25/167 |
| 2017/0358624 | A1* | 12/2017 | Takeya | H01L 25/167 |
| 2018/0012949 | A1* | 1/2018 | Takeya | H01L 51/5203 |
| 2018/0074372 | A1* | 3/2018 | Takeya | G02F 1/133514 |
| 2019/0229097 | A1* | 7/2019 | Takeya | H01L 33/0093 |
| 2019/0288049 | A1* | 9/2019 | Takeya | H01L 27/3262 |
| 2020/0083422 | A1* | 3/2020 | Takeya | H01L 27/153 |

FOREIGN PATENT DOCUMENTS

| | | |
|---|---|---|
| KR | 10-2013-0092896 | 8/2013 |
| KR | 10-2013-0137985 | 12/2013 |

OTHER PUBLICATIONS

Non-Final Office Action dated Sep. 13, 2017, in U.S. Appl. No. 15/443,132.
Notice of Allowance dated Feb. 15, 2018, in U.S. Appl. No. 15/443,132.
Non-Final Office Action dated Jul. 8, 2019, in U.S. Appl. No. 15/997,620.
Final Office Action issued on U.S. Appl. No. 15/997,620 dated Apr. 14, 2020.
Non-Final Office Action dated Aug. 18, 2020, issued to U.S. Appl. No. 15/997,620.
Notice of Allowance dated Jan. 26, 2021, in U.S. Appl. No. 15/997,620.
Non-Final Office Action dated Mar. 31, 2021, issued in U.S. Appl. No. 16/983,962.

* cited by examiner

DISPLAY APPARATUS AND MANUFACTURING METHOD THEREOF

CROSS-REFERENCE TO RELATED APPLICATIONS

This application is a Continuation of U.S. patent application Ser. No. 15/997,620, filed on Jun. 4, 2018, which is a Continuation of U.S. patent application Ser. No. 15/443,132, filed on Feb. 27, 2017, which claims the benefit of U.S. Provisional Patent Application No. 62/300,249, filed on Feb. 26, 2016, and U.S. Provisional Patent Application No. 62/379,501, filed on Aug. 25, 2016, each of which are hereby incorporated by reference for all purposes as if fully set forth herein.

BACKGROUND

Field

The invention relates generally to a display apparatus and a method of manufacturing the same, and, more particularly, to a display apparatus using micro-light emitting diodes and a method of manufacturing the same.

Discussion of the Background

A light emitting diode refers to an inorganic semiconductor device that emits light through recombination of electrons and holes. Light emitting diodes have been recently used in various fields including displays, automobile lamps, general lighting, and the like. A light emitting diode has various advantages such as long lifespan, low power consumption, and rapid response. As a result, a light emitting device using a light emitting diode is used as a light source in various fields.

Recently, smart TVs or monitors display colors using a thin film transistor liquid crystal display (TFT LCD) panel. Such color displays tend to use light emitting diodes (LEDs) as a light source for a backlight unit to display the color. In addition, a display apparatus is often manufactured using organic light emitting diodes (OLEDs).

In a TFT-LCD, since one LED is used as a light source for many pixels, a backlight light source must be kept in a turned-on state. As a result, the TFT-LCD suffers from constant power consumption regardless of brightness of a displayed screen. On the other hand, although power consumption of an OLED has been continuously reduced due to the ongoing development of the technology, the OLED still has much higher power consumption than LEDs formed of inorganic semiconductors. Thus OLEDs have low power efficiency.

Moreover, a passive matrix (PM) drive type OLED can suffer from deterioration in response speed upon pulse amplitude modulation (PAM) of the OLED having large capacitance, and can suffer from deterioration in lifespan upon high current driving through pulse width modulation (PWM) for realizing a low duty ratio. Moreover, an AM driving type OLED requires connection of TFTs for each pixel, thereby causing increase in manufacturing costs and non-uniform brightness according to characteristics of TFTs.

SUMMARY

One or more exemplary embodiments of the invention provide a display apparatus using micro-light emitting diodes having low power consumption, and the display apparatus is usable as a wearable apparatus, a smartphone or a TV, and a method of manufacturing the same.

According to one aspect of the invention, a display apparatus includes a plurality of light emitting diode modules each having a plurality of light emitting diodes regularly arranged therein, and a substrate including a drive unit configured to drive the plurality of light emitting diodes. The substrate is coupled to the plurality of light emitting diode modules such that the plurality of light emitting diode modules and substrate oppose each other, and the drive unit is electrically connected to the plurality of light emitting diodes.

The drive unit may include a plurality of TFTs and the light emitting diodes may be electrically connected to one of the plurality of TFTs, respectively.

At least some of the plurality of light emitting diode modules may have a smaller size than the substrate and may be connected to the substrate.

At least some of the plurality of light emitting diode modules may include a support substrate, a plurality of blue light emitting diodes arranged on an upper surface of the support substrate, a plurality of green light emitting diodes arranged on the upper surface of the support substrate adjacent to the plurality of blue light emitting diodes, and a plurality of red light emitting diodes arranged on the upper surface of the support substrate adjacent to either the plurality of blue light emitting diodes or the plurality of green light emitting diodes.

At least some of the plurality of blue light emitting diodes, the plurality of green light emitting diodes and the plurality of red light emitting diodes may include an n-type semiconductor layer, a p-type semiconductor layer, an active layer interposed between the n-type semiconductor layer and the p-type semiconductor layer, an n-type electrode coupled to the n-type semiconductor layer, a p-type electrode coupled to the p-type semiconductor layer, and a wall surrounding the p-type electrode.

At least some of the plurality of light emitting diode modules may include a support substrate, a plurality of light emitting diodes arranged on an upper surface of the support substrate and emitting blue light or UV light, and a phosphor layer disposed on at least some of the plurality of light emitting diodes and emitting at least one of blue light, green light and red light through wavelength conversion of at least a part of light emitted from the light emitting diodes.

The display apparatus may further include an anisotropic conductive film electrically connecting the plurality of light emitting diode modules to the substrate.

The plurality of light emitting diode modules may include a plurality of subpixels at least some of which are composed of at least one light emitting diode and regularly arranged in a matrix.

At least some of the light emitting diode modules may include an electrode substrate including a first electrode terminal and a second electrode terminal electrically insulated from each other, a plurality of light emitting diodes regularly arranged on the electrode substrate and electrically connected to the first and second electrode terminals, and a plurality of blocking portions surrounding the plurality of light emitting diodes, the plurality of blocking portions being separated from side surfaces of the plurality of light emitting diodes, and the drive unit may be electrically connected to the plurality of light emitting diodes through the first and second electrode terminals.

At least some of the plurality of light emitting diodes may include a light emitting structure including an n-type semiconductor layer, a p-type semiconductor layer and an active layer interposed between the n-type semiconductor layer and the p-type semiconductor layer, an n-type electrode disposed at a lower side of the light emitting structure and electrically connected to the n-type semiconductor layer, and a p-type electrode disposed at the lower side of the light emitting structure and electrically connected to the p-type semiconductor layer, in which the n-type electrode is electrically connected to the first electrode terminal and the p-type electrode is electrically connected to the second electrode terminal.

At least some of the plurality of light emitting diodes may further include a phosphor layer disposed on the light emitting structure and emitting light through wavelength conversion of light emitted from the light emitting structure.

At least some of the plurality of light emitting diodes may include a light emitting structure disposed on the first electrode terminal and including a first semiconductor layer, a second semiconductor layer disposed on an upper surface of the first semiconductor layer, and an active layer interposed between the first semiconductor layer and the second semiconductor layer, in which the first semiconductor layer is electrically connected to the first electrode terminal and the second semiconductor layer is electrically connected to the second electrode terminal via a wire.

According to another aspect of the invention, a method of manufacturing a display apparatus includes forming a plurality of light emitting diode modules having a plurality of light emitting diodes regularly arranged therein, forming a TFT panel part having a plurality of TFTs regularly arranged thereon and configured to drive the light emitting diodes, and coupling at least one of the plurality of light emitting diode modules to the TFT panel part such that the at least one of the plurality of light emitting diode modules and the TFT panel part oppose each other and such that the light emitting diodes are respectively electrically connected to the one of the TFTs.

The step of coupling at least one of the plurality of light emitting diode modules to the TFT panel part may include attaching an anisotropic conductive film to one surface of the TFT panel part and coupling at least one of the light emitting diode modules to the anisotropic conductive film, and may further include applying pressure to at least one of the light emitting diode modules placed on the anisotropic conductive film in a direction towards the TFT panel part.

The step of coupling at least one of the plurality of light emitting diode modules to the TFT panel part may further include applying pressure to the at least one of the light emitting diode modules placed on the anisotropic conductive film in a direction towards the TFT panel part.

The manufacturing method may further include coupling at least one other light emitting diode module of the plurality of light emitting diode modules to the TFT panel part such that the at least one other light emitting diode module and the TFT panel part oppose each other.

According to another aspect of the invention, a method of manufacturing a display apparatus includes forming a plurality of light emitting diode modules having a plurality of light emitting diodes regularly arranged therein, forming a drive substrate including a drive unit driving the plurality of light emitting diodes, and coupling at least one of the plurality of light emitting diode modules to the drive substrate at a first location such that the at least one of the plurality of light emitting diode modules and the drive substrate oppose each other and the plurality of light emitting diodes is electrically connected to the drive substrate.

The manufacturing method may further include coupling at least one other light emitting diode module of the plurality of light emitting diode modules to the drive substrate such that the at least one other light emitting diode module and the drive substrate oppose each other. The at least one other light emitting diode module among the plurality of light emitting diode modules may be coupled to the drive substrate at a second location adjacent to the first location.

According to another aspect of the invention, a light emitting diode apparatus includes a substrate, a plurality of light emitting diodes regularly arranged on the substrate and configured to emit ultraviolet (UV) light, the light emitting diodes including a first sub-light emitting diode, a second sub-light emitting diode, and a third sub-light emitting diode, a plurality of phosphor layers disposed on the light emitting diodes and to convert the wavelength of light emitted from the light emitting diodes, the phosphor layers including a first phosphor layer, a second phosphor layer, and a third phosphor layer disposed on the first sub-light emitting diode, the second sub-light emitting diode, and the third sub-light emitting diode, respectively, and a control unit configured to supply power to the light emitting diodes, in which the phosphor layers are spaced apart from each other by a blocking region, and the control unit is configured to cause at least a portion of the light emitting diodes to emit light.

The light emitting diode apparatus may further include a transparent electrode disposed on at least one of the sub-light emitting diodes to transmit light therethrough.

The blocking region may be spaced apart from side surfaces of the light emitting diodes.

The blocking region may surround one of the sub-light emitting diodes.

The light emitting diode apparatus may further include an insulation layer surrounding one of the sub-light emitting diodes.

The light emitting diodes may further include a fourth sub-light emitting diode, and the transparent electrode is disposed on the fourth sub-light emitting diode to transmit light emitted from the fourth sub-light emitting diode therethrough.

The light emitting diode apparatus may further include a protective layer disposed on at least one of the phosphor layers, in which the protective layer is directly exposed to the outside.

The light emitting diode apparatus may further include an electrode substrate and a conductor layer penetrating the electrode substrate.

At least one of the sub-light emitting diodes may include a p-type semiconductor layer, and a p-type electrode electrically contacting the p-type semiconductor layer through a via hole.

The control unit may be configured to cause only the portion of the light emitting diodes, among the light emitting diodes, to emit light.

According to another aspect of the invention, a light emitting diode apparatus includes a substrate; a plurality of light emitting diodes regularly arranged on the substrate, the light emitting diodes including a first sub-light emitting diode and a second sub-light emitting diode, a plurality of phosphor layers disposed on the light emitting diodes and to convert the wavelength of light emitted from the light emitting diodes, the phosphor layers including a first phosphor layer and a second phosphor layer disposed on the first sub-light emitting diode and the second sub-light emitting diode, respectively, and a control unit configured to supply power to the light emitting diodes, in which the phosphor layers are spaced apart from each other by a blocking region, and the control unit is configured to cause at least a portion of the light emitting diodes to emit light.

According to another aspect of the invention, a display apparatus includes a panel substrate including a TFT drive circuit for active matrix driving, a plurality of light emitting diodes, and an anisotropic conductive film electrically connecting the light emitting diodes to the panel substrate, in which the anisotropic conductive film includes an adhesive organic insulation material and conductive particles dispersed in the adhesive organic insulation material.

The display apparatus may further include a support substrate disposed on the light emitting diodes.

The display apparatus may further include a transparent electrode disposed between the support substrate and the light emitting diode.

The display apparatus may further include a blocking portion disposed between the light emitting diodes to block light emitted from one of the light emitting diodes being directed towards an adjacent one of the light emitting diodes.

The display apparatus may further include a support substrate disposed on the light emitting diodes, in which the blocking portion may be disposed on the support substrate.

The display apparatus may further include a transparent electrode disposed between the support substrate and the light emitting diode, in which the blocking portion may cover a portion of the transparent electrode.

The display apparatus may further include light emitting diode modules disposed on the panel substrate, in which each of the light emitting diode modules may include a support substrate on which the light emitting diodes are arranged.

Each of the light emitting diode modules may be disposed on the anisotropic conductive film.

Each of the light emitting diode modules may include pixels, each pixel including at least three sub-pixels configured to emit light having different colors.

Each of the light emitting diodes may include an n-type semiconductor layer, a p-type semiconductor layer, an active layer interposed between the n-type semiconductor layer and the p-type semiconductor layer, an n-type electrode coupled to the n-type semiconductor layer, and a p-type electrode coupled to the p-type semiconductor layer.

The display apparatus may further include an insulation layer surrounding the light emitting diode.

The insulation layer may cover a portion of an upper surface of the light emitting diode.

The display apparatus may further include a first connection electrode disposed on the insulation layer and electrically connected to the light emitting diode, and a second connection electrode disposed on the panel substrate and electrically connected to the TFT drive circuit, in which the anisotropic conductive film may connect the first connection electrode to the second connection electrode.

The conductive particles may be uniformly dispersed in the adhesive organic insulation material.

According to another aspect of the invention, a method of manufacturing a display apparatus includes forming a plurality of light emitting diodes, forming a panel substrate including a TFT drive circuit for active matrix driving, forming an anisotropic conductive film on the panel substrate, and coupling the plurality of light emitting diodes to the panel substrate with the anisotropic conductive film.

The method may further include forming a plurality of light emitting diode modules, each of the light emitting diode modules including a support substrate on which the light emitting diodes are regularly arranged.

Each of the light emitting diode modules may further include first connection electrodes connected to the light emitting diodes, respectively, and the panel substrate may include second connection electrodes and the anisotropic conductive film electrically connecting the first connection electrodes to the second connection electrodes.

The method may further include forming insulation layers surrounding the light emitting diodes, respectively, in which the first connection electrodes may be formed on the insulation layers.

Each of the light emitting diode modules may include pixels, each pixel including at least three sub-pixels configured to emit light having different colors.

Each of the light emitting diodes may include an n-type semiconductor layer, a p-type semiconductor layer, an active layer interposed between the n-type semiconductor layer and the p-type semiconductor layer, an n-type electrode coupled to the n-type semiconductor layer, and a p-type electrode coupled to the p-type semiconductor layer.

Accordingly, in various exemplary embodiments, the display apparatus employs micro-light emitting diodes formed of nitride semiconductors; and, a light emitting diode part including a plurality of micro-light emitting diodes is formed as a unit module. Thus, the light emitting diode part can be more conveniently coupled to a TFT panel part.

In addition, in various exemplary embodiments, the light emitting diode part is formed in a predetermined size such that a desired number of light emitting diodes parts can be coupled to TFT panel parts having various sizes. Thus, the display apparatus can be more conveniently manufactured in various sizes.

Furthermore, since the light emitting diode parts are constituted as a plurality of modules in some embodiments of the invention, any one of the light emitting diodes can be replaced by a new light emitting diode when the corresponding light emitting diode is defective, thereby providing a display apparatus having an improved display quality. Furthermore, since inspection of the light emitting diodes can be performed in a module unit in some embodiments of the invention, it is possible to reduce the rate at which final products in manufacture of the display apparatus are defective.

BRIEF DESCRIPTION OF DRAWINGS

The accompanying drawings, which are included to provide a further understanding of the disclosed technology, and are incorporated in and constitute a part of this specification, illustrate exemplary embodiments of the disclosed technology, and together with the description serve to describe the principles of the disclosed technology.

DETAILED DESCRIPTION OF ILLUSTRATED EMBODIMENTS

Figure 1:
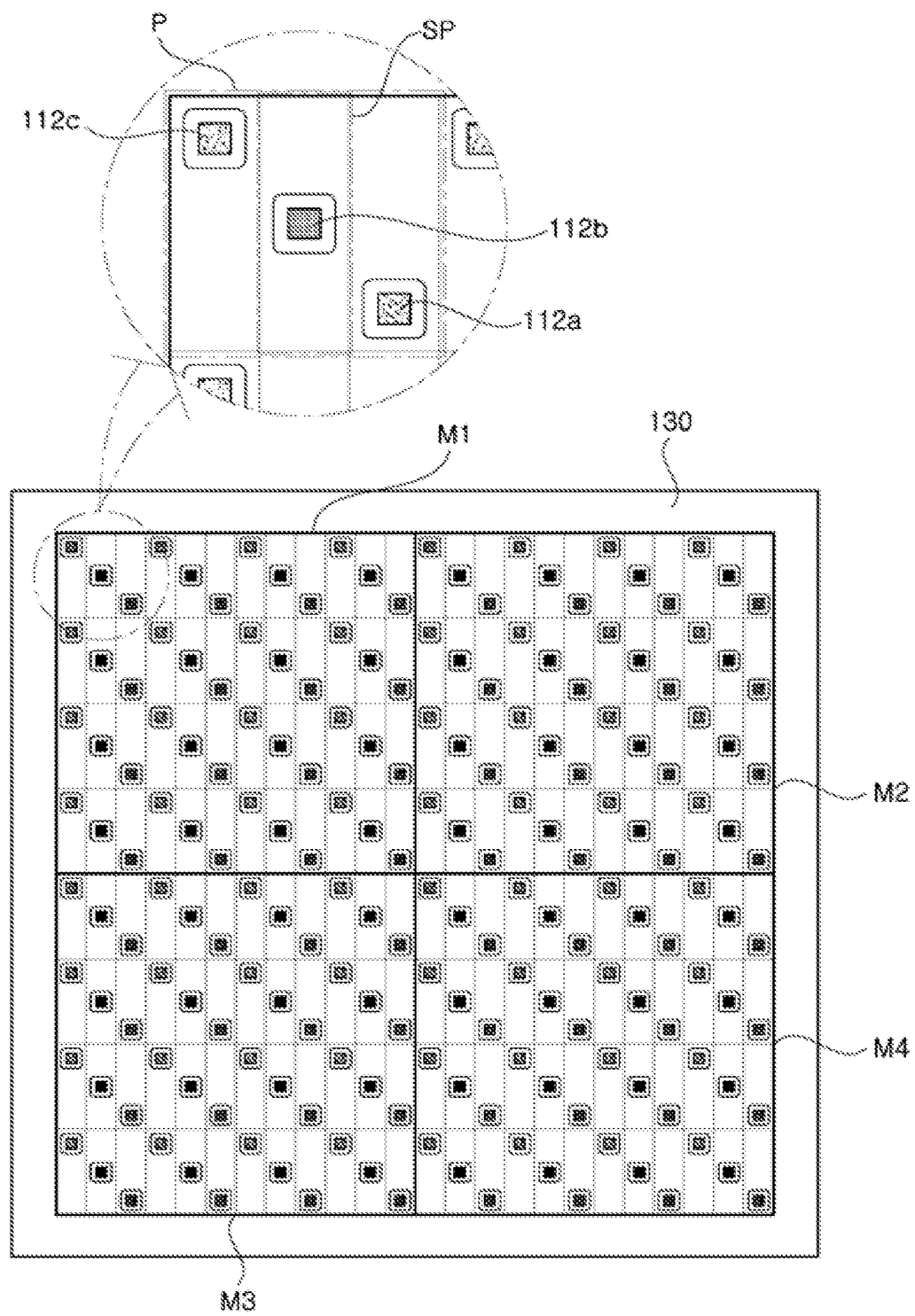
FIG. 1 is a plan view of a first embodiment of a display apparatus constructed according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, various exemplary embodiments of the invention will be described in detail with reference to the accompanying drawings.

Figure 2:
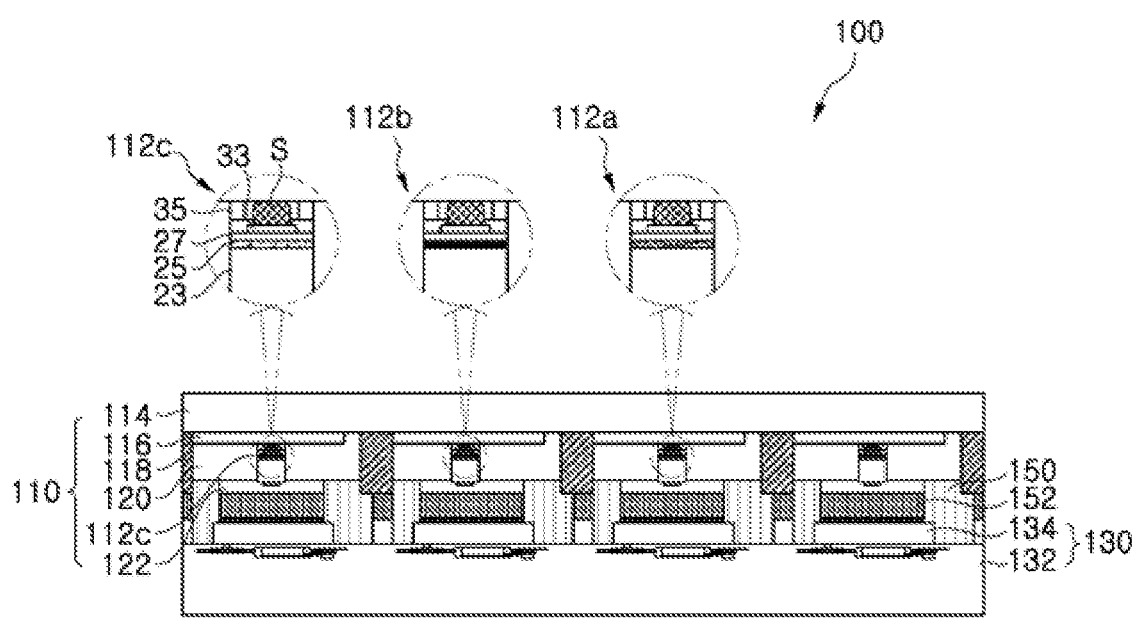
FIG. 2 is a cross sectional view of the display apparatus of FIG. 1.

FIG. 1 is a plan view of a first embodiment of a display apparatus constructed according to the principles of the invention. FIG. 2 is a cross sectional view of the display apparatus of FIG. 1.

Referring to FIG. 1 and FIG. 2, the display apparatus 100 according to the first exemplary embodiment includes a light emitting diode part 110, a TFT panel part 130, and an anisotropic conductive film 150.

The light emitting diode part 110 includes light emitting diodes 112, a support substrate 114, transparent electrodes 116, a blocking portion 118, an insulation layer 120, and first connection electrodes 122. As shown in FIG. 2, in the light emitting diode part 110, the transparent electrode 116, the light emitting diode 112, the blocking portion 118, the insulation layer 120 and the first connection electrode 122 are formed in a generally vertical structure on the support substrate 114 to constitute one subpixel (SP) in the display apparatus 100, and the light emitting diode part 110 may be composed of a plurality of subpixels SP.

The light emitting diode part 110 may constitute a plurality of light emitting diode modules M1, M2, M3, M4, as shown in FIG. 1. Three subpixels SP constitute one pixel P and each of the light emitting diode modules M1, M2, M3, M4 is constituted by a plurality of pixels P. That is, the light emitting diode module includes a plurality of pixels.

The light emitting diode part 110 includes a plurality of light emitting diodes 112, which are regularly arranged on the support substrate 114. For example, the plural light emitting diodes 112 may be arranged at constant intervals in a "checkerboard" matrix, as shown in FIG. 1, or other type of matrix form. The plurality of the light emitting diodes 112 may include a plurality of blue light emitting diodes 112a emitting blue light, a plurality of green light emitting diodes 112b emitting green light, and a plurality of red light emitting diodes 112c emitting red light. The plurality of blue light emitting diodes 112a, the plurality of green light emitting diodes 112b and the plurality of red light emitting diodes 112c are alternately arranged so as to be adjacent to one another.

In the display apparatus 100, the light emitting diode part 110 may be driven by power applied from an exterior power source and an image can be reproduced through an on-off combination of the light emitting diodes 112 in the light emitting diode part 110 without using a separate LCD.

Referring to FIG. 2, each of the light emitting diodes 112 includes an n-type semiconductor layer 23, an active layer 25, a p-type semiconductor layer 27, an n-type electrode 31, a p-type electrode 33, and a wall 35.

The n-type semiconductor layer 23, the active layer 25 and the p-type semiconductor layer 27 may include Group III-V based compound semiconductors. By way of example, the n-type semiconductor layer 23, the active layer 25 and the p-type semiconductor layer 27 may include nitride semiconductors such as (Al, Ga, In)N. Locations of the n-type semiconductor layer 23 and the p-type semiconductor layer 27 can be interchanged.

The n-type semiconductor layer 23 may include an n-type dopant (for example, Si) and the p-type semiconductor layer 27 may include a p-type dopant (for example, Mg). The active layer 25 is interposed between the n-type semiconductor layer 23 and the p-type semiconductor layer 27. The active layer 25 may have a multi-quantum well (MQW) structure and the composition of the active layer 25 may be determined so as to emit light having a desired peak wavelength.

In addition, the light emitting structure including the n-type semiconductor layer 23, the active layer 25 and the p-type semiconductor layer 27 may be formed similar to a vertical type light emitting diode 112. In this structure, the n-type electrode 31 may be formed on an outer surface of the n-type semiconductor layer 23 and the p-type electrode 33 may be formed on an outer surface of the p-type semiconductor layer 27.

Furthermore, as shown in FIG. 2, a bonding portion S may be formed between the p-type electrode 33 and the transparent electrode 116 in order to couple the light emitting diode 112 similar to the vertical type light emitting diode to the transparent electrode 116 formed on the support substrate 114. Here, the wall 35 may be formed on the light emitting diode 112 to prevent the bonding portion S from escaping from a space between the p-type electrode 33 and the transparent electrode 116.

The wall 35 may be formed to cover a portion of the p-type electrode 33 such that the p-type electrode 33 can be exposed on the p-type semiconductor layer 27, and may be composed of a plurality of layers, as shown in the drawings.

The wall 35 may include a first layer and a second layer, and may be formed by forming the first layer including SiN on the p-type semiconductor layer 27 so as to cover a portion of the p-type electrode 33, followed by forming the second layer including $SiO_2$ on the first layer. The second layer may have a greater thickness and a smaller width than the first layer.

The support substrate 114 is a substrate on which the plurality of light emitting diodes 112 will be mounted, and may be an insulation substrate, a conductive substrate, or a printed circuit board. By way of example, the support substrate 114 may be at least one of a sapphire substrate, a gallium nitride substrate, a glass substrate, a silicon carbide substrate, a silicon substrate, a metal substrate, and a ceramic substrate. The support substrate 114 may be a transparent substrate in order to allow light emitted from the light emitting diodes 112 to pass therethrough. By way of example, the support substrate 114 may be formed as a flexible glass substrate having a certain thickness.

The transparent electrode 116 may be formed on the support substrate 114 and may be electrically connected to the p-type electrode 33 of the light emitting diode 112. A plurality of transparent electrodes 116 may be formed on the support substrate 114 and may be coupled to the plurality of light emitting diodes 112, respectively. Alternatively, the plurality of light emitting diodes 112 may be coupled to one transparent electrode 116. In addition, the transparent electrodes 116 may be separated from each other on the support substrate 114. The transparent electrodes 116 may be formed of indium tin oxide (ITO) and the like.

The blocking portion 118 is formed on the support substrate 114 and may be provided in plural. The blocking portion 118 prevents light emitted from a certain light emitting diode from being directed towards other light emitting diodes 112 adjacent thereto when light emitted from the light emitting diodes 112 is emitted to the outside through the transparent electrodes 116. Accordingly, the blocking portion 118 may be formed between the transparent electrodes 116 separated from each other and may be formed to cover a portion of each of the transparent electrodes 116. The blocking portion 118 is formed of aluminum (Al) or chromium (Cr).

The insulation layer 120 may surround the light emitting diode 112 and cover an exposed surface of a connecting plane between the light emitting diode 112 and the transparent electrode 116 while covering the transparent electrode 116. In the structure wherein the insulation layer 120 surrounds the light emitting diode 112, the n-type semiconductor layer 23 and the n-type electrode 31 of the light emitting diode 112 can be exposed through the insulation layer 120.

The first connection electrode 122 covers the insulation layer 120 and may also cover the n-type semiconductor layer 23 and the n-type electrode 31 not covered by the insulation layer 120. Accordingly, the first connection electrode 122 may be electrically connected to the n-type semiconductor layer 23.

The TFT panel part 130 includes a panel substrate 132 and second connection electrodes 134, and is coupled to the light emitting diode part 110 to supply power to the light emitting diode part 110. The TFT panel part 130 may control power supplied to the light emitting diode part 110 to allow only some of the light emitting diodes 112 in the light emitting diode part 110 to emit light.

The panel substrate 132 has a TFT drive circuit therein. The TFT drive circuit may be a circuit for driving an active matrix (AM) or a circuit for driving a passive matrix (PM).

The second connection electrodes 134 may be electrically connected to the TFT drive circuit of the panel substrate 132 and to the first connection electrodes 122 of the light emitting diode part 110. In this structure, power supplied through the TFT drive circuit can be supplied to each of the light emitting diodes 112 through the first and second connection electrodes 122, 134. The second connection electrodes 134 may be covered by a separate protective layer, which may include, for example, $SiN_x$.

The anisotropic conductive film 150 serves to electrically connect the light emitting diode part 110 to the TFT panel part 130. The anisotropic conductive film 150 may include an adhesive organic insulation material and may contain conductive particles uniformly dispersed therein to achieve electrical connection. The anisotropic conductive film 150 exhibits conductivity in the direction of its thickness and insulating properties in the orthogonal planar direction of its width and length. In addition, the anisotropic conductive film 150 exhibits adhesive properties. Thus, the anisotropic conductive film 150 may be used to bond the light emitting diode part 110 to the TFT panel part 130 such that the light emitting diode part 110 can be electrically connected to the TFT panel part 130 therethrough. Particularly, the anisotropic conductive film 150 may be advantageously used to connect ITO electrodes which are difficult to solder at high temperature.

As such, in the structure wherein the light emitting diode part 110 is coupled to the TFT panel part 130 via the anisotropic conductive film 150, the first connection electrodes 122 of the light emitting diode part 110 may be electrically connected to the second connection electrodes 134 of the TFT panel part 130 via an electrode connection portion 152.

Figure 3:
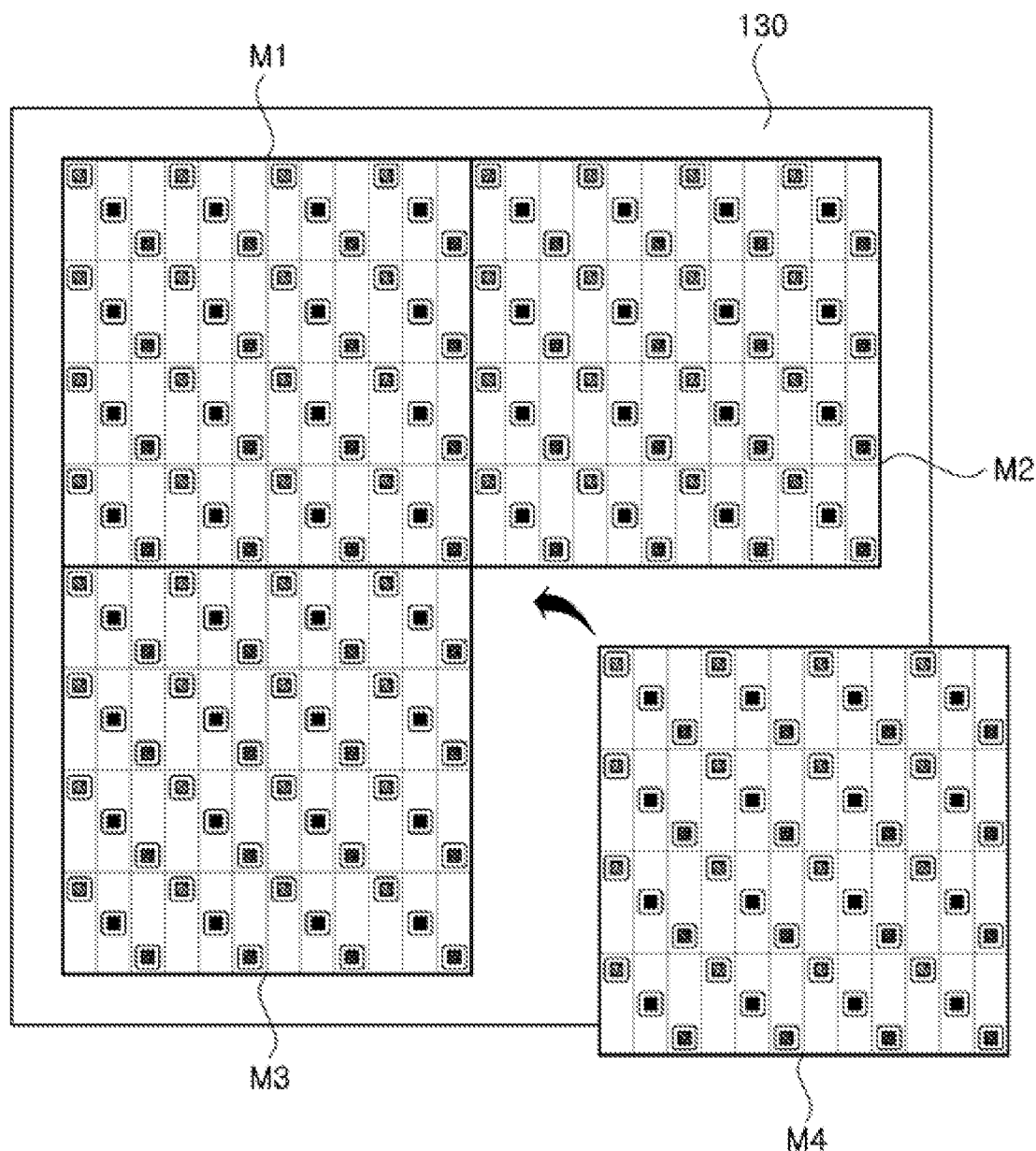
FIG. 3 is a partially exploded plan view of the display apparatus of FIG. 1 illustrating a step in a method of manufacturing the display apparatus according to the principles of the invention.
Figure 4A:
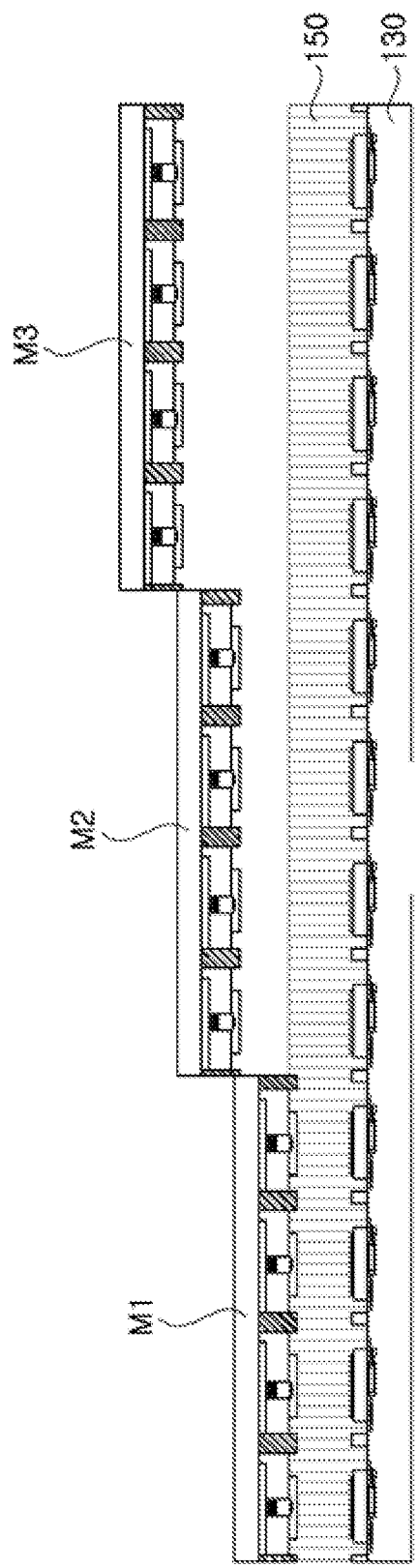
FIG. 4A and FIG. 4B are cross sectional views of the display apparatus of FIG. 1 illustrating steps in a process for coupling light emitting diode modules of the display apparatus to a TFT panel part in an exemplary method of manufacturing the display apparatus according to the principles of the invention.
Figure 4B:
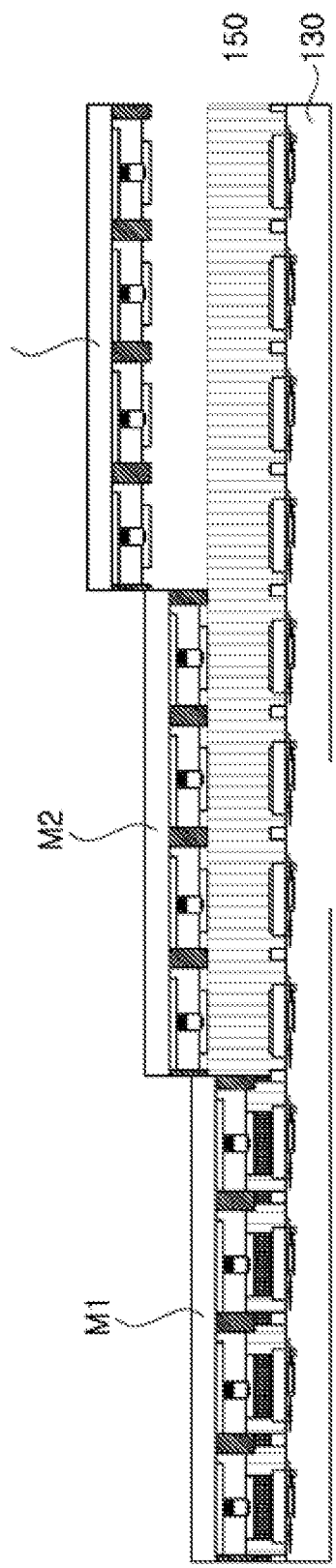

FIG. 3 is a partially exploded plan view of the display apparatus of FIG. 1 illustrating a step in a method of manufacturing the display apparatus according to the principles of the invention. FIG. 4A and FIG. 4B are cross sectional views of the display apparatus of FIG. 1 illustrating steps in a process for coupling light emitting diode modules of the display apparatus to a TFT panel part in an exemplary method of manufacturing the display apparatus according to the principles of the invention.

Referring to FIG. 3, a plurality of light emitting diode modules M1, M2, M3, M4 may be coupled to one TFT panel part 130 having a large area. FIG. 3 shows a process for coupling a fourth light emitting diode module M4 to the large TFT panel part 130 to which first through third light emitting diode modules M1, M2, M3 are coupled.

As described above, the TFT panel part 130 includes a plurality of second connection electrodes 134 formed on an upper surface of the panel substrate 132, which has a plurality of TFT drive circuits formed therein. Since the TFT drive circuits control power supply to the light emitting diode part 110, the TFT circuits suffer from less failure even in the structure wherein the TFT panel part 130 has a large area.

As shown in FIG. 4A, the anisotropic conductive film 150 is formed on an upper surface of the TFT panel part 130 and each of the plurality of light emitting diode modules M1, M2, M3, M4 is placed on the anisotropic conductive film 150 to be coupled to the TFT panel part 130. Here, each of the light emitting diode modules M1, M2, M3, M4 may be coupled to a portion of the large TFT panel part 130 and the light emitting diode modules M1, M2, M3, M4 may be adjacent to each other on the TFT panel part 130.

As described above, the anisotropic conductive film 150 may include an adhesive organic material and exhibits conductivity in the direction of its thickness. In addition, the anisotropic conductive film 150 may be compressed to exhibit conductivity in the thickness direction thereof upon application of pressure thereto. Thus, as shown in FIG. 4B, when pressure is applied to the light emitting diode modules M1, M2, M3, M4 placed on the anisotropic conductive film 150, the light emitting diode modules M1, M2, M3, M4 can be coupled to the TFT panel part 130.

In this way, when pressure is applied to the light emitting diode modules M1, M2, M3, M4 placed on the anisotropic conductive film 150, each of the plurality of light emitting diode modules M1, M2, M3, M4 can be coupled to the large TFT panel part 130.

Figure 5:
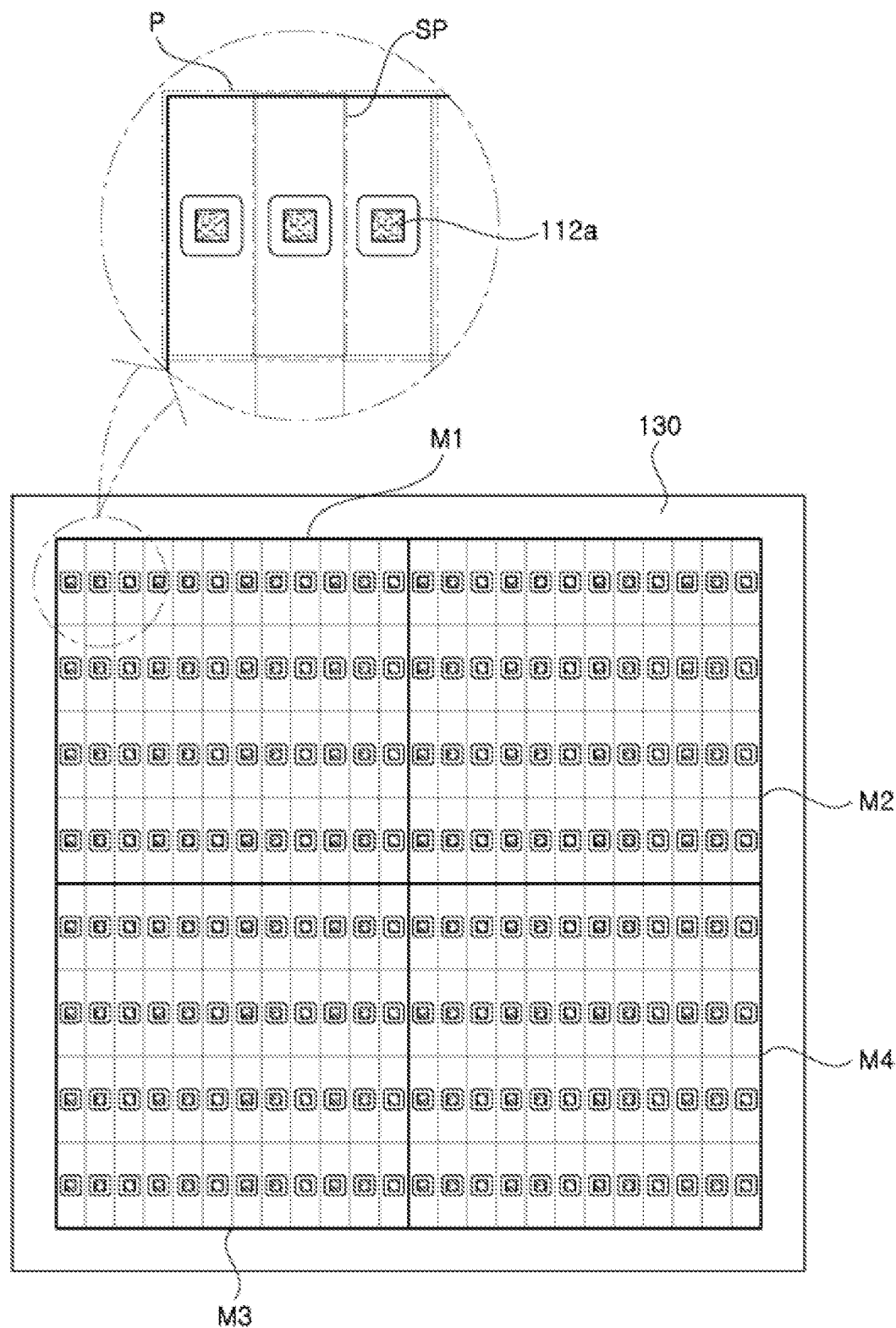
FIG. 5 is a plan view of a second embodiment of a display apparatus constructed according to the principles of the invention.
Figure 6:
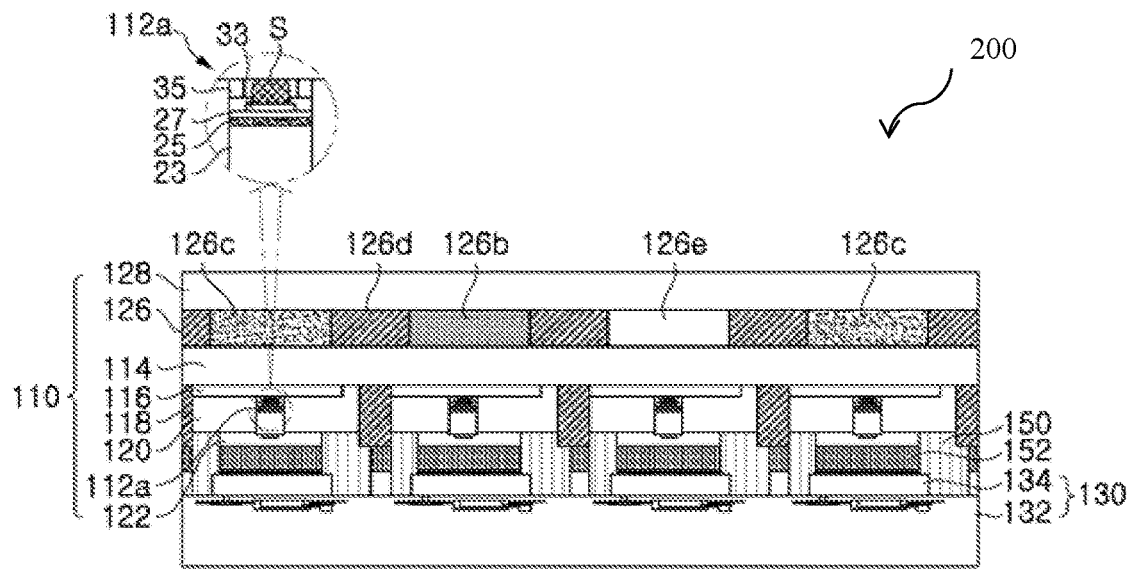
FIG. 6 is a cross sectional view of the display apparatus of FIG. 5.

FIG. 5 is a plan view of a second embodiment of a display apparatus constructed according to the principles of the invention. FIG. 6 is a cross sectional view of the display apparatus of FIG. 5.

Referring to FIG. 5 and FIG. 6, the display apparatus 100 according to the second exemplary embodiment includes a light emitting diode part 110, a TFT panel part 130, and an anisotropic conductive film 150. The light emitting diode part 110 includes light emitting diodes, a support substrate 114, a transparent electrode 116, a blocking portion 118, an insulation layer 120, and first connection electrodes 122. The TFT panel part 130 includes a panel substrate 132 and second connection electrodes 134. Hereinafter, descriptions of the same components as previously described will be omitted to avoid redundancy.

In FIG. 5, blue light emitting diodes 112a are used as the light emitting diodes. Referring to FIG. 5, a plurality of blue light emitting diodes 112a is regularly arranged on the support substrate 114. Accordingly, light emitting diode modules M1, M2, M3, M4 each including the plurality of blue light emitting diodes 112a arranged thereon may be formed. A plurality of light emitting diode modules M1, M2, M3, M4 may thus be formed, as shown in FIG. 5.

With this structure, the plurality of light emitting diode modules M1, M2, M3, M4 may be coupled to one TFT panel part 130 having a large area so as to be adjacent to one another. Here, each of light emitting diode modules M1, M2, M3, M4 may be coupled to the TFT panel part by the anisotropic conductive film 150.

Further, since each of the light emitting diode modules M1, M2, M3, M4 includes the blue light emitting diodes 112a arranged thereon, the display apparatus 100 may further include a phosphor layer 126 to emit blue light, green light and red light.

The phosphor layer 126 may emit light through conversion of blue light emitted from the blue light emitting diodes 112a into green light or red light. To this end, the phosphor layer 126 may be formed on the upper surface of the support substrate 114 and may include a green phosphor layer 126b, a red phosphor layer 126c, and a transparent layer 126e. In addition, a blocking layer 126d may be formed between the green phosphor layer 126b, the red phosphor layer 126c and the transparent layer 126e. The green phosphor layer 126b, the red phosphor layer 126c and the transparent layer 126e may be alternately arranged to be separated from one another by at least a predetermined minimum distance. In addition, the blocking layer 126d may be formed between the green phosphor layer 126b, the red phosphor layer 126c and the transparent layer 126e. The green phosphor layer 126b, the red phosphor layer 126c and the transparent layer 126e may be alternately arranged to be adjacent to one another or to be separated from one another by at least a predetermined minimum distance.

The green phosphor layer 126b converts the wavelength of blue light emitted from the light emitting diodes 112 to emit green light, and the red phosphor layer 126c converts the wavelength of blue light emitted from the blue light emitting diodes 112a to emit red light. In addition, the transparent layer 126e is placed near the green phosphor layer 126b and the red phosphor layer 126c to allow blue light emitted from the light emitting diodes 112a to pass therethrough. Accordingly, red light, green light and blue light can be emitted through the phosphor layer 126.

A protective substrate 128 may be formed on an upper surface of the phosphor layer 126. The protective substrate 128 can protect the phosphor layer 126 from an external environment by preventing the phosphor layer 126 from being directly exposed to the outside. Like the support substrate 114, the protective substrate 128 may be formed of a transparent material.

Figure 7:
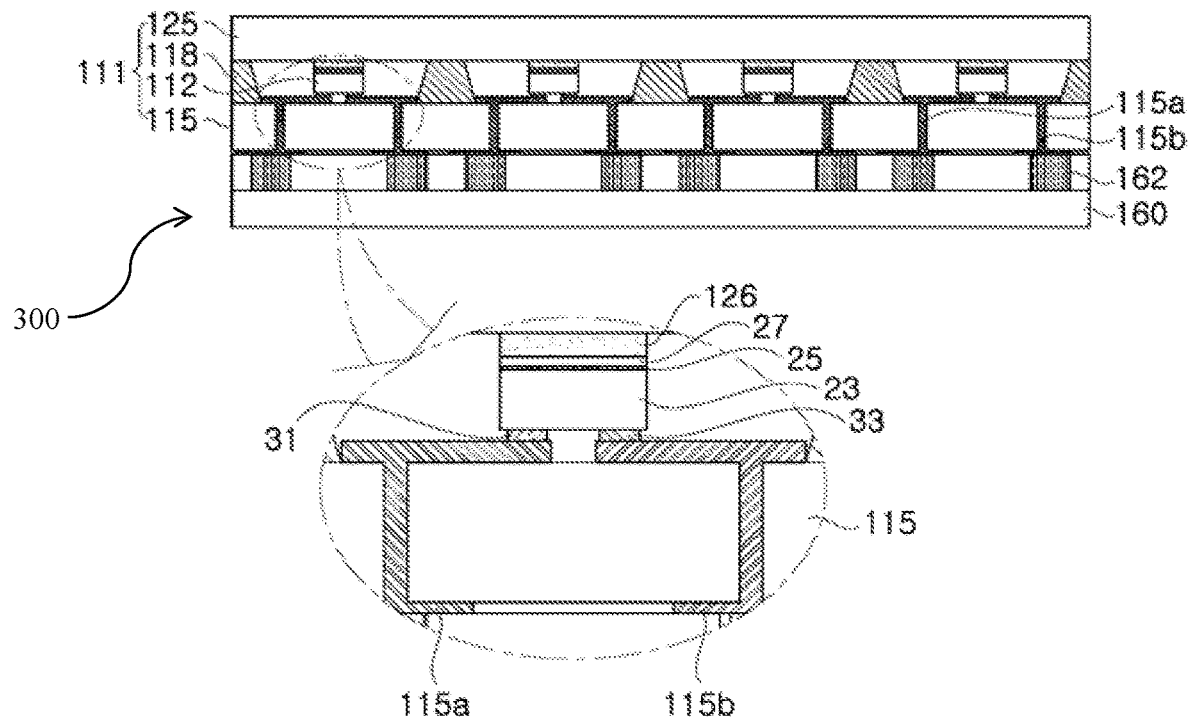
FIG. 7 is a cross sectional view of a third embodiment of a display apparatus constructed according to the principles of the invention.

FIG. 7 is a cross sectional view of a third embodiment of a display apparatus constructed according to the principles of the invention.

Referring to FIG. 7, the depicted display apparatus 100 includes a light emitting diode part 110 and a drive substrate 160. Descriptions of the same components as previously described will hereinafter be omitted to avoid redundancy.

The light emitting diode part 110 includes light emitting diodes 112, an electrode substrate 115 and a blocking portion 118, and may further include a protective substrate 128. As shown in FIG. 7, a plurality of the light emitting diodes 112 may be disposed on an upper surface of the electrode substrate 115 and the blocking portion 118 may be disposed between the light emitting diodes 112. Accordingly, a region formed by the blocking portion 118 may be each subpixel of the display apparatus 100.

The light emitting diode part 110 may include a plurality of light emitting diodes 112, which are regularly arranged on the electrode substrate 115. The light emitting diodes 112 can emit blue light or ultraviolet (UV) light. To this end, each of the light emitting diodes 112 includes a light emitting structure including an n-type semiconductor layer 23, a p-type semiconductor layer 27 and an active layer 25 interposed between the n-type semiconductor layer 23 and the p-type semiconductor layer 27, and may further include a phosphor layer 126 disposed on an upper surface of the light emitting structure. Further, an n-type electrode 31 and a p-type electrode 33 may be disposed on a lower surface of the light emitting structure.

Since each of the light emitting diodes 112 includes the n-type semiconductor layer 23 disposed at the lower side thereof, the n-type electrode 31 directly electrically contacts the n-type semiconductor layer 23 and the p-type electrode 33 electrically contacts the p-type semiconductor layer 27 through a via-hole.

In addition, the phosphor layer 126 is disposed on the light emitting structure. The phosphor layer 126 serves to convert the wavelengths of light emitted from the light emitting diodes 112 and various kinds of phosphor layers 126 may be used. The light emitting diodes 112 emit blue light or UV light and the phosphor layer 126 may include one of a blue phosphor layer, a green phosphor layer and a red phosphor layer.

That is, when light to be emitted from a subpixel is red light and the light emitting diodes 112 are the blue light emitting diodes or the UV light emitting diodes, the phosphor layer 126 is the red phosphor layer. In addition, when light to be emitted from a subpixel is green light and the light emitting diodes 112 are the blue light emitting diodes or the UV light emitting diodes, the phosphor layer 126 is the green phosphor layer. In addition, when the UV light emitting diodes are used and light to be emitted from a subpixel is blue light, the phosphor layer 126 may be the blue phosphor layer.

Here, the electrode substrate 115 is a substrate on which the plurality of the light emitting diodes 112 is mounted, and may be formed with a first electrode terminal 115a and a second electrode terminal 115b. The electrode substrate 115 is generally formed of an insulation material, and the first electrode terminal 115a and the second electrode terminal 115b are formed in some regions of the electrode substrate 115. As shown in FIG. 7, each of the first electrode terminal 115a and the second electrode terminal 115b is formed to penetrate the electrode substrate 115 from an upper surface thereof to a lower surface thereof. In addition, each of the first electrode terminal 115a and the second electrode terminal 115b may have a predetermined width on the upper and lower surfaces of the electrode substrate 115.

The first electrode terminal 115a and the second electrode terminal 115b may be separated from each other so as to be electrically insulated from each other. In addition, a space between the first electrode terminal 115a and the second electrode terminal 115b exposed on the upper and lower surfaces of the electrode substrate 115 may be filled with an insulating material.

The first electrode terminal 115a contacts a first electrode on the upper surface of the electrode substrate to be electrically connected thereto and the second electrode terminal 115b contacts a second electrode on the upper surface thereof to be electrically connected thereto.

The drive substrate 160 is disposed under the light emitting diode part 110 and may be electrically connected to the first electrode terminal 115a and the second electrode terminal 115b exposed on the lower surface of the light emitting diode part 110. To this end, the drive substrate 160 may have an electrode terminal connection portion 162 exposed on an upper surface thereof. The drive substrate 160 may include a plurality of electrode terminal connection portions 162, each of which is electrically connected to the first electrode terminal 115a and the second electrode terminal 115b. Accordingly, electric power supplied from an external power source can be supplied to the first electrode terminal 115a and the second electrode terminal 115b through the electrode terminal connection portions 162 and a drive unit 164 described below.

Figure 8:
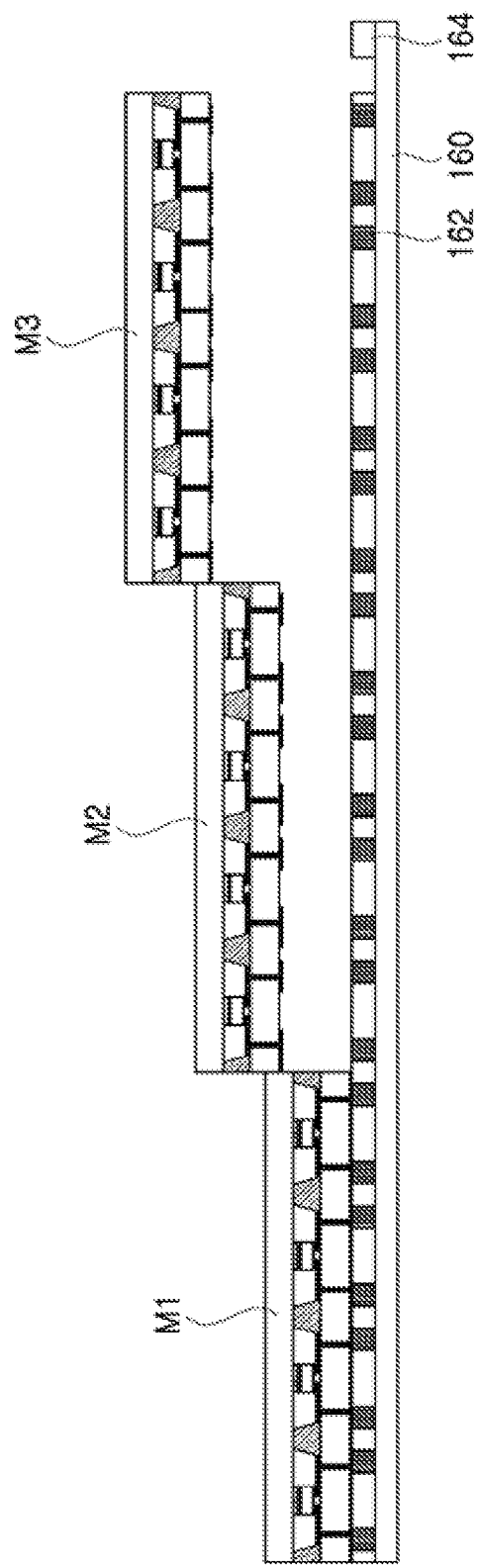
FIG. 8 is a cross sectional view of the display apparatus of FIG. 7 illustrating a step in a process for coupling light emitting diode modules of the display apparatus to a drive substrate in an exemplary method of manufacturing the display apparatus according to the principles of the invention.

FIG. 8 is a cross sectional view of the display apparatus of FIG. 7 illustrating a step in a process for coupling light emitting diode modules of the display apparatus to a drive substrate in an exemplary method of manufacturing the display apparatus according to the principles of the invention.

Referring to FIG. 8, a plurality of light emitting diode modules M1 to M3 may be coupled to an upper surface of one drive substrate 160. Each of the light emitting diode modules M1 to M3 is obtained by modularization of a predetermined number of light emitting diode parts 110 as described above with reference to FIG. 7.

That is, each of the plurality of light emitting diode modules M1 to M3 may be coupled to the upper surface of the drive substrate 160. As shown in FIG. 8, each of the plurality of light emitting diode modules M1 to M3 is coupled one-by-one to the upper surface of the drive substrate 160. A first light emitting diode module M1 is coupled to the upper surface of the drive substrate 160, a second light emitting diode module M2 is coupled thereto to be disposed adjacent to the first light emitting diode module M1, and a third light emitting diode module M3 is finally coupled thereto in a like orientation.

The light emitting diode modules M1 to M3 may be coupled to the drive substrate 160 by a surface mount technology (SMT) method or using a separated adhesive material. The light emitting diode modules M1 to M3 are coupled to the drive substrate 160 such that the first electrode terminal 115a and the second electrode terminal 115b exposed on the lower surface of each of the light emitting diode modules M1 to M3 are electrically connected to the electrode terminal connection portions 162 of the drive substrate 160.

The drive unit 164 may be disposed at one side of the drive substrate 160 and may include the TFT drive circuits as described above. The drive unit 164 is electrically connected to the electrode terminal connection portion 162 and may control light emission of each of the light emitting diodes 112 in each of the plurality of light emitting diode modules M1 to M3 through electrode terminal connection portions 162.

Figure 9:
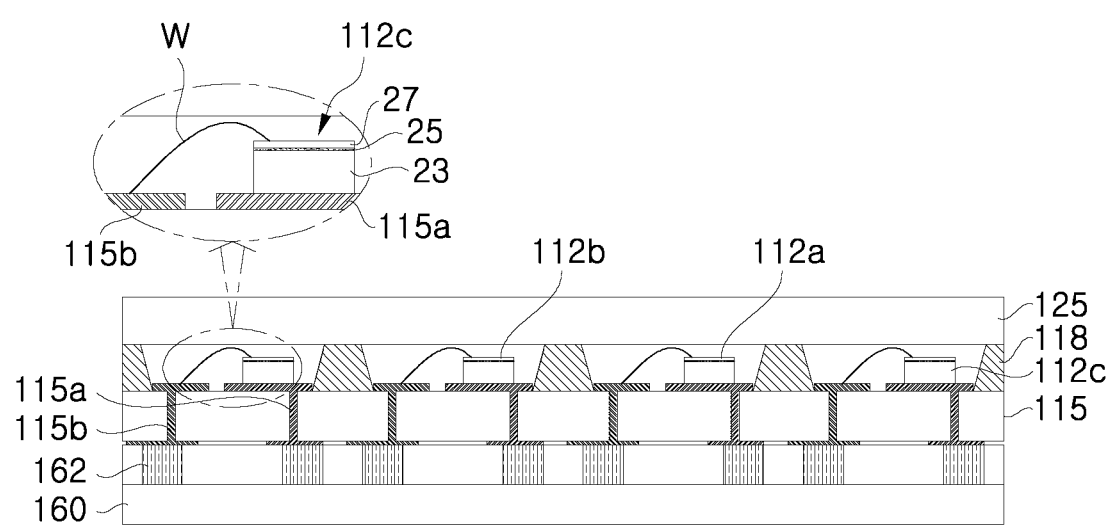
FIG. 9 is a cross sectional view of a fourth embodiment of a display apparatus constructed according to the principles of the invention.

FIG. 9 is a cross sectional view of a fourth embodiment of a display apparatus constructed according to the principles of the invention.

Referring to FIG. 9, the display apparatus 100 includes a light emitting diode part 110 and a drive substrate 160. Descriptions of the same components as those previously described will hereinafter be omitted to avoid redundancy.

The light emitting diode part 110 includes a plurality of light emitting diodes 112, which are regularly arranged on an electrode substrate 115. The light emitting diodes 112 are vertical type light emitting diodes. Each of the light emitting diodes 112 is mounted on a first electrode terminal 115a of the electrode substrate 115 and is electrically connected to the first electrode terminal 115a. As previously described in connection with third exemplary embodiment, the light emitting diode 112 includes an n-type semiconductor layer 23 at a lower side thereof and a p-type semiconductor layer 27 at an upper side thereof such that the first electrode terminal 115a is electrically connected to the n-type semiconductor layer 23. In addition, the p-type semiconductor layer 27 is electrically connected to a second electrode terminal 115b formed on the electrode substrate 115 via a wire W.

Further, here the light emitting diodes 112 include blue light emitting diodes 112a, green light emitting diodes 112b and red light emitting diodes 112c, each of which is mounted on the corresponding first electrode terminal 115a. The blue light emitting diodes 112a emit blue light, the green light emitting diodes 112b emit green light, and the red light emitting diodes 112c emit red light. As shown, the plural blue light emitting diodes 112a, the plural green light emitting diodes 112b and the plural red light emitting diodes 112c are alternately arranged to be adjacent to one another.

The electrode substrate 115 has the same structure the third exemplary embodiment and includes the first electrode terminal 115a and the second electrode terminal 115b. In this embodiment, since the light emitting diode 112 is mounted on the first electrode terminal 115a, the first electrode terminal 115a may have a larger area on the upper surface of the electrode substrate 115 than the second electrode terminal 115b thereon.

Although certain exemplary embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

What is claimed is:

1. A display apparatus comprising:
   a panel substrate including a TFT drive circuit for active matrix driving;
   a plurality of light emitting diodes;
   a first connection electrode disposed between the light emitting diode and the panel substrate, the first connection electrode having a first surface facing the light emitting diode, a second surface facing the panel substrate, and a side surface connecting the first and second surfaces;
   a second connection electrode disposed on the panel substrate, the second connection electrode having a side surface substantially parallel to the side surface of the first connection electrode; and
   an anisotropic conductive film contacting the side surfaces of the first and second connection electrodes and connecting the first connection electrode and the second connection electrode to electrically connect the light emitting diodes to the panel substrate,
   wherein the anisotropic conductive film includes an adhesive organic insulation material and conductive particles dispersed in the adhesive organic insulation material.

2. The display apparatus of claim 1, further comprising a support substrate disposed on the light emitting diodes.

3. The display apparatus of claim 2, further comprising a transparent electrode disposed between the support substrate and the light emitting diode.

4. The display apparatus of claim 1, further comprising a blocking portion disposed between the light emitting diodes to block light emitted from one of the light emitting diodes being directed towards an adjacent one of the light emitting diodes.

5. The display apparatus of claim 4, further comprising a support substrate disposed on the light emitting diodes,
   wherein the blocking portion is disposed on the support substrate.

6. The display apparatus of claim 5, further comprising a transparent electrode disposed between the support substrate and the light emitting diode,
   wherein the blocking portion covers a portion of the transparent electrode.

7. The display apparatus of claim 1, further comprising light emitting diode modules disposed on the panel substrate,
   wherein each of the light emitting diode modules comprises a support substrate on which the light emitting diodes are arranged.

8. The display apparatus of claim 7, wherein each of the light emitting diode modules are disposed on the anisotropic conductive film.

9. The display apparatus of claim 8, wherein each of the light emitting diode modules comprises pixels, each pixel including at least three sub-pixels configured to emit light having different colors.

10. The display apparatus of claim 1, wherein each of the light emitting diodes comprises:
    an n-type semiconductor layer;
    a p-type semiconductor layer;
    an active layer interposed between the n-type semiconductor layer and the p-type semiconductor layer;
    an n-type electrode coupled to the n-type semiconductor layer; and a p-type electrode coupled to the p-type semiconductor layer.

11. The display apparatus of claim 1, further comprising an insulation layer surrounding the light emitting diode.

12. The display apparatus of claim 11, wherein the insulation layer covers a portion of an upper surface of the light emitting diode.

13. The display apparatus of claim 12, wherein:
the first connection electrode is directly disposed on the insulation layer and is electrically connected to the light emitting diode; and
the second connection electrode is electrically connected to the TFT drive circuit.

14. The display of claim 1, wherein the conductive particles are uniformly dispersed in the adhesive organic insulation material.

* * * * *